United States Patent

Kobayashi

[15] 3,648,128

[45] Mar. 7, 1972

[54] AN INTEGRATED COMPLEMENTARY TRANSISTOR CIRCUIT CHIP WITH POLYCRYSTALLINE CONTACT TO BURIED COLLECTOR REGIONS

[72] Inventor: Isamu Kobayashi, Kanagawa-ken, Japan

[73] Assignee: Sony Corporation, Tokyo, Japan

[22] Filed: May 21, 1969

[21] Appl. No.: 826,437

Related U.S. Application Data

[63] Continuation-in-part of Ser. No. 774,702, Nov. 12, 1968, Continuation-in-part of Ser. No. 774,703, Nov. 12, 1968.

[30] Foreign Application Priority Data

May 25, 1968 Japan..................................43/35385

[52] U.S. Cl. .................317/235 R, 317/235 AT, 317/235 E, 317/235 F, 317/235 G, 317/235 D

[51] Int. Cl. .....................................H01l 19/00, H01l 11/00

[58] Field of Search..................................................317/235

[56] References Cited

UNITED STATES PATENTS

| | | | |
|---|---|---|---|
| 3,341,755 | 9/1967 | Husher et al. | 317/235 |
| 3,327,182 | 6/1967 | Kisinko | 317/235 |
| 3,414,783 | 12/1968 | Moore | 317/235 |
| 3,427,709 | 2/1969 | Schutze | 29/580 |
| 3,312,882 | 4/1967 | Pollock | 317/235 |
| 3,475,661 | 10/1969 | Iwata et al. | 317/234 |
| 3,474,308 | 10/1969 | Kronlage | 317/235 |

OTHER PUBLICATIONS

Boss et al., IBM Tech. Discl. Bull., Vol. 10, No. 2, July 1967, pp. 164–165.

*Primary Examiner*—John W. Huckert
*Assistant Examiner*—Martin H. Edlow
*Attorney*—Hill, Sherman, Meroni, Gross & Simpson

[57] ABSTRACT

An integrated semiconductor device having a monocrystalline semiconductor substrate of one conductivity type, a diffused layer in the substrate of the opposite conductivity type, a vapor deposited layer formed on the substrate, the vapor deposited layer including a monocrystalline region, and a polycrystalline region of high-impurity concentration surrounding the monocrystalline region and extending from the diffused layer to the surface of the vapor deposited layer, a second monocrystalline region surrounding the polycrystalline region, and monocrystalline regions of high-impurity concentration contiguous to both sides of the polycrystalline region, the monocrystalline regions of high-impurity concentration having the same conductivity type as that of the polycrystalline region and forming a PN junction with the adjoining monocrystalline region.

3 Claims, 18 Drawing Figures

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

AN INTEGRATED COMPLEMENTARY TRANSISTOR CIRCUIT CHIP WITH POLYCRYSTALLINE CONTACT TO BURIED COLLECTOR REGIONS

CROSS REFERENCES TO RELATED APPLICATIONS

This application is a continuation-in-part of both my copending applications, Ser. Nos. 774,702 and 774,703 both filed Nov. 12, 1968. The subject matter of this application also employs techniques which are more fully described in my copending application, Ser. No. 781,542 filed Dec. 5, 1968, the disclosure of which is hereby incorporated by reference.

BACKGROUND OF THE INVENTION

1. Field of the Invention

This invention is in the field of making integrated circuits of improved isolation characteristics and involves selective diffusion and heat treating to isolate components of the integrated circuit from each other.

2. DESCRIPTION OF THE PRIOR ART

Integrated circuit technology has developed considerably in the past ten years or so but numerous problems still remain. One of the major problems is still proper isolation of the elements from each other in view of the extremely small spacing which exists between the elements. For example, if a PNP-type transistor is incorporated in a semiconductor integrated circuit, the surface of the element is covered with an oxide film except for the electrode portions so that an N-type channel is formed on the surface of the collector region of P-type conductivity underlying the oxide film. The existence of this channel introduces the possibility of generating a leakage current between an N-type base region and an N-type isolating region which serves to isolate the transistor from the other elements of the integrated circuit. This causes a decrease in the breakdown voltage between the collector and the base of the transistor and causes an increase in the stray capacity between the collector and the base of the transistor.

SUMMARY OF THE INVENTION

The present invention is directed to an improved semiconductor device in which a polycrystalline layer of high-impurity concentration is formed by vapor deposition techniques in the collector region of the transistor such as to enclose or encircle the base region thereby avoiding the formation of an N-type channel on the surface of the collector region, while providing an improved means for providing a collector electrode thereon. The result is the production of an integrated circuit having excellent isolation characteristics, high power capacity, and reduced stray capacity.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

FIG. 1 illustrates one example of the invention as applied to the manufacture of a PNP-type transistor which is to be incorporated into a semiconductor integrated circuit.

Figure 1A:
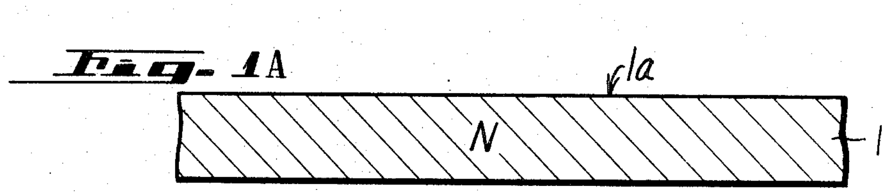
FIGS. 1A through 1G show somewhat schematically a sequence of steps involved in the manufacture of a transistor in accordance with one form of the present invention.
Figure 1B:
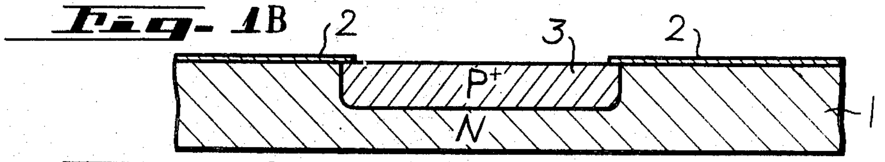

The first step is to prepare an N-type single crystal silicon substrate 1 of a predetermined thickness such as shown in FIG. 1A. The silicon substrate 1 is coated over its upper surface 1*a* except in a preselected central area with a silicon dioxide film 2 by using typical masking procedures of the type well known and described in the prior art. Then, a P-type impurity is diffused to a high concentration into the portion of the substrate 1 which has not been covered with a silicon dioxide film 2, thus forming a $P^+$ high impurity concentration region identified as a diffused region 3 in FIG. 1B.

Figure 1C:
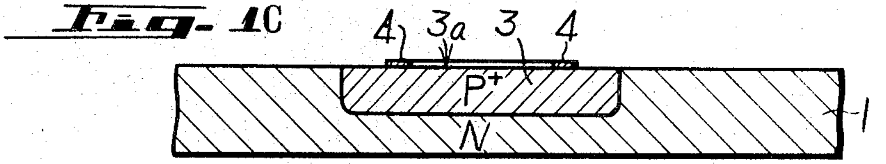
Figure 1D:
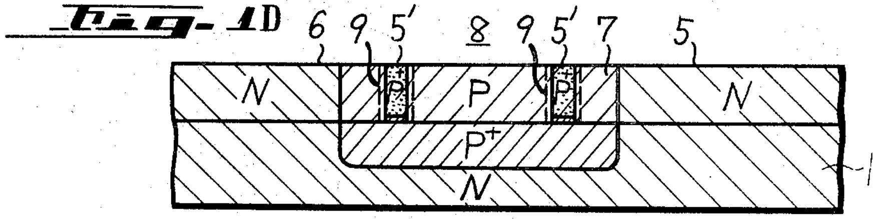

In the next step, the silicon dioxide film 2 is entirely removed and then a seeding site 4 for polycrystalline development is formed over the P-type region 3 so as to circumscribe its central portion as illustrated in FIG. 1C. Means of providing such a seeding site 4 are disclosed in the aforementioned copending application, Ser. No. 781,542 filed Dec. 5, 1968. For example, the seeding site 4 may consist of a thin layer of silicon dioxide selectively deposited through masking techniques in the predetermined area.

The next step consists in forming an intrinsic vapor deposited layer on the entire area of the substrate 1 including the area overlying the seeding site 4 by means of conventional vapor deposition and crystal growth techniques. This provides a polycrystalline region 5′ over the seeding site 4 and a single crystal region 5 on the other areas of the surface of the substrate 1. The resulting single crystal regions 5 are not completely I-type but are generally somewhat N-type particularly where the N-type silicon layer is vapor deposited by thermal decomposition of a silicon halide. Then, the resulting assembly is subjected to a heat treatment at temperatures in excess of 1,000° C. to cause inter-diffusion of the impurities present. Thus, the N-type impurity of the substrate 1 is diffused into the vapor deposited layer 5 which has grown on the substrate 1 and the P-type impurity of the diffused layer 3 is diffused into the layer 5 to form a P-type region 7 of lower impurity concentration than exists in the diffused layer 3, thereby providing a P-type island region 8. The P-type impurity is also diffused from the diffused layer 3 upwardly into the polycrystalline region 5′, and the diffusion velocity in the region 5′ is extremely high because of its polycrystalline structure, so that high concentration impurity diffusion is achieved in a short time thereby rendering the polycrystalline region 5′ a P-type region of higher impurity concentration than the other P-type regions. At the same time, similar P-type high impurity concentration regions 9 are formed in the single crystal regions contiguous with the polycrystalline region 5′ as shown by the dotted lines in FIG. 1D.

Figure 1E:
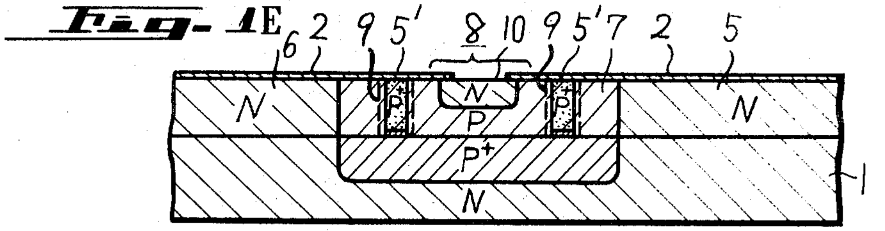
Figure 1F:
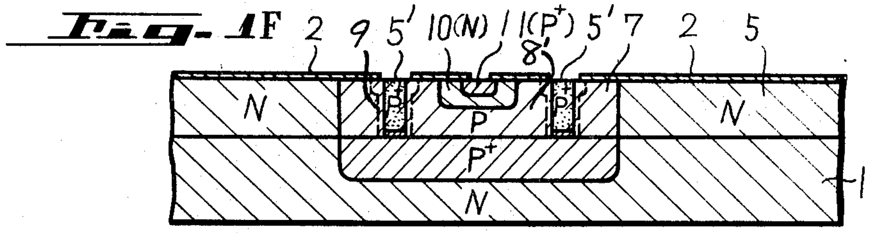

The next step involves diffusing an N-type impurity into the island region 8 which is surrounded by the polycrystalline region 5′ through a window formed in a silicon dioxide film 2 serving as a mask, thus forming a base region 10 as illustrated in FIG. 1E. Then, a P-type impurity of high concentration is diffused into a selected area of the base region 10 to provide therein an emitter region 11 as shown in FIG. 1F. Preferably, the P-type impurity is diffused into the polycrystalline region 5′ concurrently with the formation of the emitter region 11 so as to provide for enhanced impurity concentration in the polycrystalline region 5′.

Figure 1G:
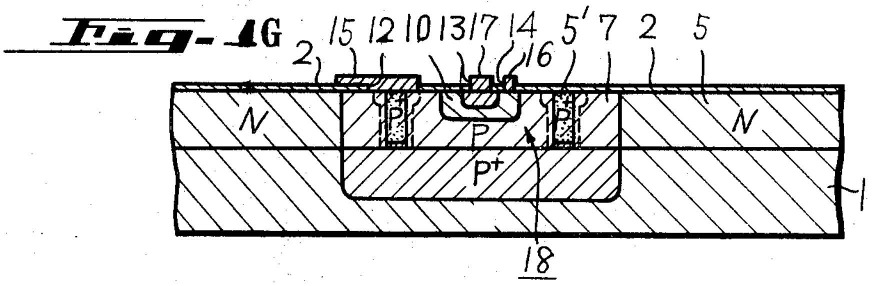

After the formation of the emitter region 11, another silicon dioxide layer 2 is formed over the N-type layer 5 and is etched away selectively at those areas at which electrodes are to be attached to the emitter 11, base 10 and the collector 8′, these areas being identified as windows 12, 13 and 14. Next, aluminum or other metal layers are vapor deposited on the exposed areas through the windows 12, 13 and 14 to provide collector, base and emitter electrodes 15, 16 and 17 as shown in FIG. 1G. The collector electrode 15 is located on the polycrystalline region 5′.

Figure 2:
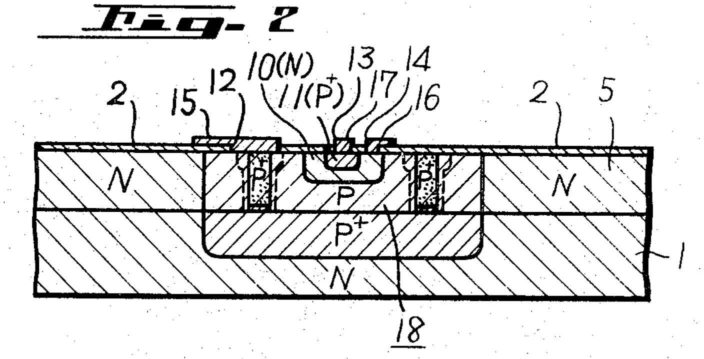
FIG. 2 is an enlarged cross-sectional view of a PNP-type transistor produced according to the method of the present invention.
Figure 3:
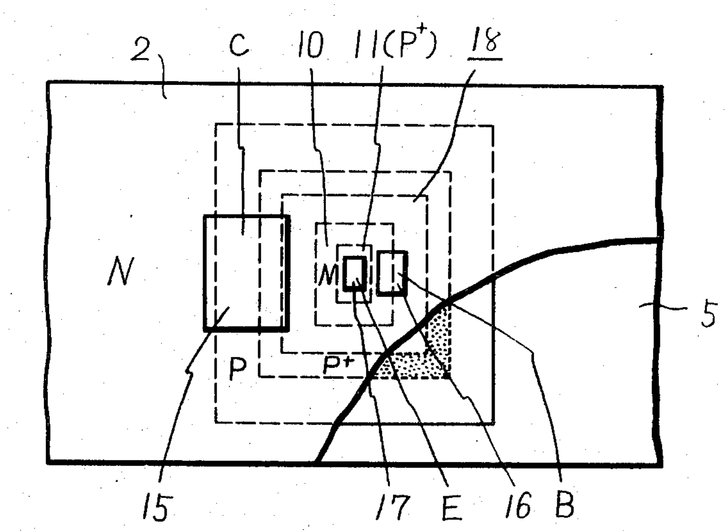
FIG. 3 is a plan view of the transistor shown in FIG. 2 with portions thereof broken away to illustrate the construction more completely.

The finished transistor 18 is shown in FIGS. 2 and 3. The emitter electrode has been identified at "E," the base electrode at "B" and the collector electrode at "C."

With this type of arrangement, since the polycrystalline region 5′ of high impurity concentration and the high impurity concentration 9 adjoining it are formed in the collector region 8' surrounding the base region 10, no N-type channel is formed in the polycrystalline region 5' on the surface of the collector region 8' underlying the oxide film, thus preventing the generation of a leakage current between the N-type substrate 1 and the N-type base region 10.

Furthermore, the surface areas of the collector region 8' within and outside of the high-impurity concentration region 9 are $N^-$-type regions of high resistance as previously mentioned. The surface area within the region 9 has a similar effect to that of one portion of the base region and forms a $PN^-$ junction between it and the region 9, and the surface area on the outside of the region 9 also forms a $PN^-$ junction therebetween. This improves the breakdown voltage characteristics of the junction between the base and collector of the transistor near the surface thereof thereby enhancing the isolation characteristics. In addition, since the polycrystalline region 5' having a high-impurity concentration is formed continuous with the diffused layer 3, the collector can be readily connected electrically to outside circuit elements through the collector electrode 15 located on the polycrystalline region 5' and the resistance of the collector 8' in the longitudinal direction, that is, the collector saturation resistance, can be substantially reduced.

The presence of the polycrystalline region 5' and the high impurity concentration regions 9 adjoining it reduce the stray capacity between the collector and the base of the transistor.

Figure 4A:
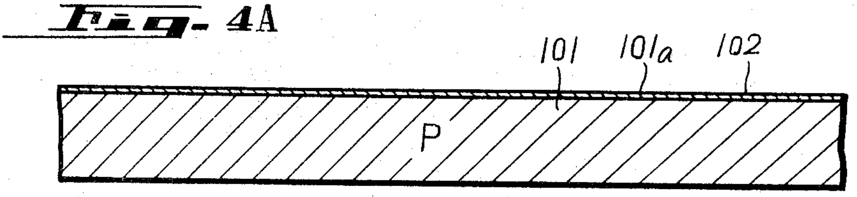
FIGS. 4A through 4I are somewhat schematic illustrations showing the production of a complete integrated semiconductor circuit in various stages of manufacture.

Another example of the present invention, as it is applied to the manufacture of a semiconductor integrated circuit, is illustrated in FIGS. 4A through 4I. In the first step, a silicon substrate 101 composed, for example, of a material of P-type conductivity is provided which has a resistivity of from 4 to 6 ohm cm., and a thickness of about 100 to 200 microns. At least one surface 101a of the substrate 101 is covered with a masking layer 102 to serve as an impurity diffusion mask, as illustrated in FIG. 4A. The formation of the diffusion mask 102 may take place by means of thermal decomposition and vapor deposition of a silicon oxide, or surface oxidation of the substrate, or by other means well known in the art.

Figure 4B:
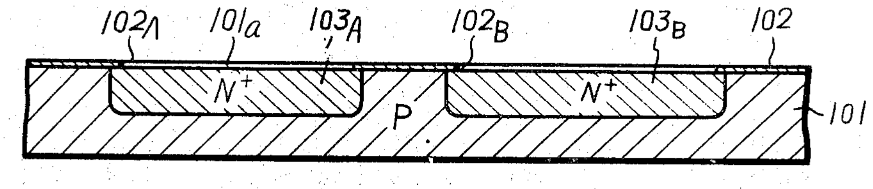
Figure 4C:
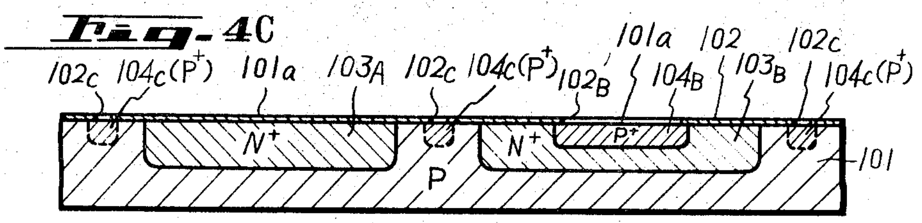

The next step is to form two separate windows 102A and 102B in the diffusion mask layer 102 by the usual photoetching techniques or the like. Then, an impurity of the opposite conductivity type to that of the substrate 101 which, in the example given, would be an N-type impurity is diffused into the substrate 101 through the windows 102A and 102B to provide two spaced N-type island regions 103A and 103B of high impurity concentration as shown in FIG. 4B. Subsequent to or simultaneously with the formation of the regions 103A and 103B,, a masking layer 102 similar to the aforementioned diffusion masking layer is formed on the surface **101*a* exposed through the windows 102*a* and 102B. The diffusion masking layer 102 is selectively removed, for example, by photoetching techniques to form a window 102B' on the N-type region 103B and, in addition, a peripheral window 102C surrounding the regions 103A and 103B. Then, an impurity of the opposite conductivity type to that in the region 103B, that is, a P-type impurity is diffused through the windows 102B' and 102C into the substrate 101 to form a P-type high-impurity concentration region 104B along a limited area in the region 103B and a peripheral P-type region 104C surrounding the N-type regions 103A and 103B** as shown in FIG. 4C.

Figure 4D:
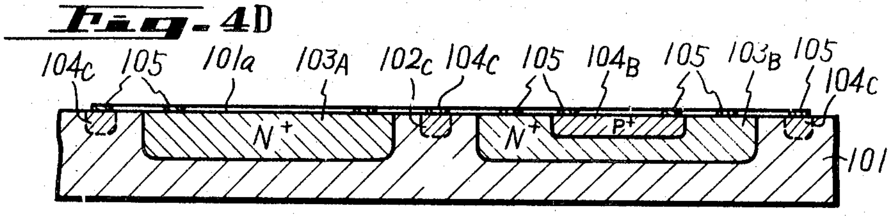

Following this, the diffusion masking layer 102 remaining on the surface **101*a* of the substrate 101 is entirely etched away and the surface 101*a* is treated to provide a clean mirror-like surface. Seeding sites or nuclei 105 for the growth of polycrystalline semiconductive layers are then formed on the surface 101*a* in predetermined patterns, as shown in FIG. 4D. The seeding sites 105 are arranged in annular form at the peripheral portions of the N-type regions 103A and 103B and the P-type region 104B and also are located above the peripheral regions 104C. The seeding sites 105 may be formed of a material having a lattice constant different from that of the substrate 101 or they may be formed of a noncrystalline material, or they may be formed by roughening of scratching the surface of the substrate 101** to disturb the lattice therein. The preferred seeding sites consist of vapor-deposited silicon layers having a thickness of, for example, several hundred angstroms to several microns. These sites do not have a masking effect toward subsequently diffused impurities.

Figure 4E:
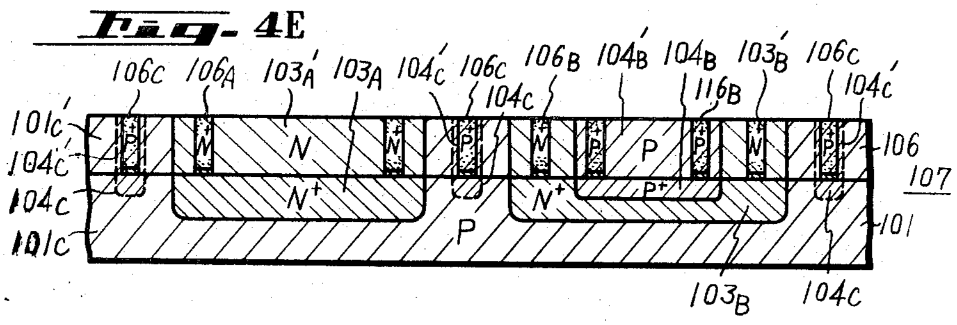

The next step consists in growing a semiconductor layer 106 composed of silicon to a thickness, for example, of tens of microns over the surface **101*a* of the substrate 101 including the seeding sites 105. The resulting structure is shown in FIG. 4E and the entire structure is indicated by reference numeral 107. The portions of the semiconductor layer 106 which have been deposited from vapor state and grown on the seeding sites 105 are polycrystalline and those portions which have been grown directly on the surface 101a of the substrate 101 in those areas in which there were no seeding sites are monocrystalline. Thus, the semiconductor layer 106 consists of annular polycrystalline semiconductor portions 106A and 106B formed on the regions 103A and 103B, a similar annular polycrystalline semiconductor region 116B formed on the P-type region 104B, and a peripheral polycrystalline semiconductor portion 106C formed on the region 104C and single crystal portions formed on the other regions. The deposited layer 106 is formed substantially of an intrinsic, that is, a high resistance semiconductor to a thickness of, for example, 5 to 16 microns. The vapor deposition in crystal growth takes place at temperatures on the order of 1,050° to 1,250° C., and the impurities of the respective regions of the substrate 101 under these conditions are diffused into the semiconductor layer 106 simultaneously with the deposition and growth of the semiconductor layer 106. Accordingly, the N-type impurity of the N-type regions 103A and 103B is diffused into the semiconductor layer 106 to form N-type regions 103A' and 103B' which are contiguous to the regions 103A and 103B. The P-type impurity of the P-type regions 104B and 104C is similarly diffused into the semiconductor layer 106 to form P-type regions 104B' and 104C' contiguous to the regions 104B and 104C. In addition, the P-type impurity of the other remaining portion 101C of the substrate 101 is diffused into the other remaining portions of the semiconductor layer 106 to form a P-type region 101C'**.

The regions 103A', 103B', 104B', 104C' and 101C' extend up to the surface 106A of the semiconductor layer 106 or to the vicinity thereof but they are rather low in impurity concentration near the surfaces and tend to be $N^-$-type. On the other hand, in the polycrystalline semiconductor portions 106A, 106B, 116B and 106C, the impurity diffusion velocity is very much higher than in the single crystal portions, and consequently the impurities of the regions 103A, 103B, 104B and 104C of the substrate 101 are sufficiently diffused into the polycrystalline semiconductor portions 106A, 106B, 116B and 106C and the portions adjoining them. In these portions, the impurity concentrations are extremely high and the impurities are diffused up to the surface of the semiconductor layer 106. Even in the case where the seeding sites 105 are formed of a material such as a silicon oxide which has a masking effect toward impurities, the impurities of the substrate 101 are diffused through portions adjoining the seeding sites 105 into the polycrystalline semiconductor regions 106A, 106B, 116B and 106C and the surrounding portions therethrough.

Following the formation of the layer 106, a masking layer 102' which has a masking effect similar to that of the diffusion masking layer 102 is provided on the surface **106*a* of the semiconductor layer 106 and is selectively etched away to form a window 102A' on the N-type region 103A', an annular window 102B' on the polycrystalline portion 116B of the P-type region 104B' and the peripheral window 102C' on the polycrystalline portion 106C. Then, an impurity of the opposite conductivity type to that of the substrate 101, that is, a P-type impurity is diffused through the windows 102A' 102B' and 102C' into the exposed region 103A' and portions 116B and 106C to provide a P-type region 108A in the N-type region 103A' and high-impurity concentration regions 126B** and 126C in the polycrystalline semiconductor portions 116B and 106C and the portions surrounding them, as illustrated in FIG. 4F.

Subsequent to or simultaneously with the impurity diffusion, a diffusion mask layer 102′ is formed on the surface 106*a* of the semiconductor layer 106 in the windows 102A′, 102B′ and 102C′ and is selectively removed by means of photoetching or the like to form windows 112A and 112B on the P-type regions 108A and 104B′ of the semiconductor layer 106 and annular windows 112A′ and 112B′ on the polycrystalline semiconductor portions 106A and 106B which overlie the N-type regions 103A′ and 103B′. Then, an impurity of the opposite conductivity type to that of the regions 108A and 104B′, that is, an N-type impurity is diffused through the windows 112A, 112B, 112A′ and 112B′ to form N-type regions 109A and 109B in the P-type regions 108A and 104B′ and N-type high impurity concentration regions 136A and 136B which include the polycrystalline semiconductor portions 106A and 106B and the portions adjoining them, as shown in FIG. 4G.

Figures 4F, 4G, 4H, 4I:
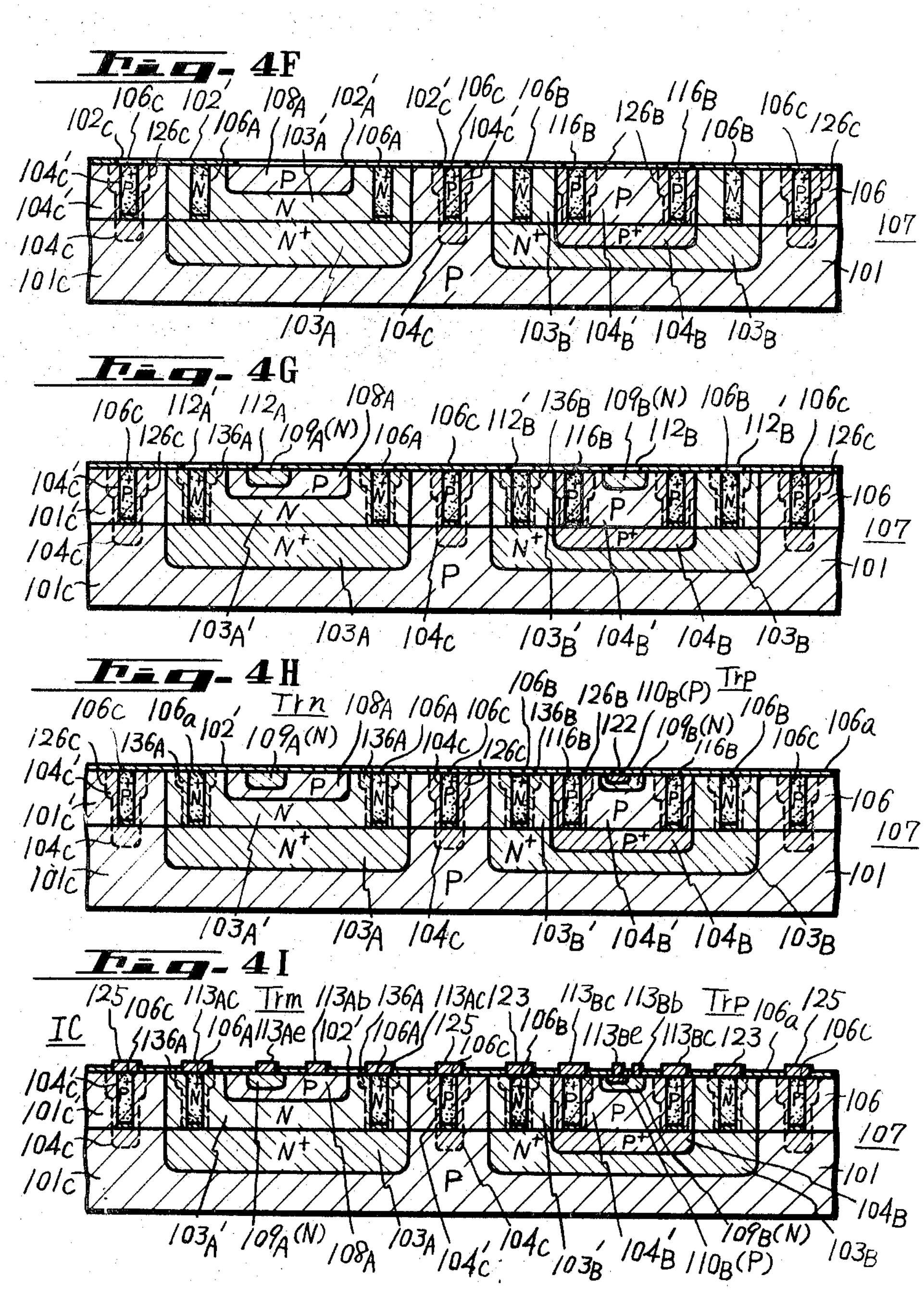

Subsequent to or concurrently with the impurity diffusion above described in connection with FIG. 4G, an impurity diffusion mask 102′ is formed on the surface 106*a* of the semiconductor layer 106 at the windows 112A, 112B, 112A′ and 112B′ and the mask layer 102′ is etched away at a predetermined area overlying the N-type region 109B to provide a window 122 through which an impurity of the opposite conductivity type, namely a P-type impurity is diffused into the N-type region 109B to form a P-type region 110B as shown in FIG. 4H. In this manner, there are formed on the common semiconductor substrate 107 an NPN-type transistor element Trn which has a collector region consisting of the N-type regions 103A and 103A′, a base region formed by the P-type region 108A and an emitter region formed by the N-type region 109A, in combination with a PNP-type transistor element Trp which has a collector region consisting of the P-type regions 104B and 104B′, a base region formed by the N-type region 109B and an emitter region formed by the P-type region 110B.

The final step consists in forming the electrodes for the various transistor elements. Annular collector electrodes 113A*c* and 113B*c* are formed to provide ohmic contact with the high-impurity concentration regions 136A and 126B, respectively, including the polycrystalline semiconductor portions 106A and 106B of the transistor elements Trn and Trp. Base electrodes 113A*b* and 113B*b* of the transistor elements Trn and Trp are formed with ohmic contact on the base regions 108A and 109B. Emitter regions 113A*e* and 113B*e* are connected with ohmic contact on the emitter regions 109A and 110B. In the island region 103B′ an electrode 123 is formed annularly on the high-impurity concentration region 136B to include the polycrystalline portion 106B and an electrode 125 is formed on the high impurity concentration region 126C including the polycrystalline portion 106C in the region 101C′ which has been formed to circumscribe the two transistor elements. The complete semiconductor integrated circuit device IC with the two types of transistor elements therein formed on a common substrate is illustrated in FIG. 4I.

With the method of the present invention, the impurity in the region 103B is diffused into the region 103B′ through the polycrystalline semiconductor portion 106B and the diffusion of the N-type impurity into the region 106B is achieved simultaneously with the formation of the base of the transistor so that the PNP-type transistor can be completely isolated from the substrate regions 101C and 101C′.

The semiconductor integrated circuit thus produced is one in which the electrode 125 can be supplied with a minimum potential when in use to apply a reverse bias to the PN junction formed between the island regions 103B and 103B′ having formed therein the transistor element Trp and the regions 101C and 101C′ and to the PN junction formed between the regions 101C and 101C′ and the collector regions 103A and 103A′ of the NPN-type transistor element, thus ensuring electrical isolation of the two transistor elements.

In the collector portions of the transistor elements Trn and Trp of the integrated circuit IC, the portions forming the collector junctions consist of relatively low impurity concentration regions 103A′ and 104B′ formed by the impurities diffused from the high impurity concentration regions 103A and 104B, so that the breakdown voltages of the collector junctions are improved.

Furthermore, those portions of the collector regions which do not form the collector junctions, that is, the high impurity concentration regions 103A and 104B are electrically connected to the electrodes 113A*c* and 113B*c* through high impurity concentration regions 136A and 126B leading to the surface 106*a* of the semiconductor substrate 107. Consequently, the collector saturation resistances of the transistor elements Trn and Trp can be substantially reduced. The regions 101C′, 103A′, 103B′ and 104B′ are formed by the diffusion of impurities from the regions 101C, 103A, 103B and 104B of the semiconductor substrate so that the impurity concentrations of these regions gradually decrease as the surface of the semiconductor layer 106 in the areas of the electrodes is approached but since the polycrystalline semiconductor portions 106C, 106A, 106B and 116B of high-impurity diffusion efficiency are present, regions 126C, 136A, 136B and 126B are high conductivity regions leading up to the electrodes. It has been found that the electrical resistance of a polycrystalline semiconductor portion can be decreased to about one-tenth that of a single crystal semiconductor portion by diffusing an impurity therein under the same conditions.

The P-type region 101C which circumscribes the two transistor elements should be of relatively low impurity concentration so as to increase their breakdown voltages. In the prior art, however, where the semiconductor layer 106 is formed entirely of a single crystal material, the impurity concentration of a region such as 101C was required to be relatively high to diffuse the impurity into the layer 106 up to its upper surface. In the present invention, the polycrystalline semiconductor portion 106C has a high-diffusion velocity so the impurity concentration of the region 101C need not be as high.

In addition, in accordance with the present invention, the PNP- and NPN-type transistors are formed on a common semiconductor substrate, and their manufacturing processes can be carried out simultaneously, so that a considerable time saving may be effected.

In addition, in the case of a PNP-NPN transistor complementary circuit, the surface portions of the collector regions of both transistors form high-resistance layers because the impurities of the sub-surface layers do not diffuse well up to the surfaces of the collector regions. The surface portion of the collector, for example, of the PNP transistor forms an N-type layer to provide a junction between it and the $P^+$-type region, and consequently a high base collector breakdown voltage can be obtained.

While the present invention has been described in connection with the substrate 101 which is P-type and a substrate 1 which is N-type the process is equally applicable to substrates of the opposite conductivity types.

I claim as my invention:

1. An integrated circuit chip comprising a plurality of layers including a substrate layer of semiconductor material and at least one superimposed layer of semiconductor material above said substrate layer, the uppermost of said layers having monocrystalline regions and polycrystalline regions, said uppermost layer having at least one PNP transistor and at least one NPN transistor completely formed in the same layer in separate ones of said monocrystalline regions, each of said transistors including an emitter of one conductivity type, a base of an opposite conductivity type and forming a base-emitter junction in each of said transistors, and a collector below each of said bases of said one conductivity type and forming a collector-base junction in each of said transistors, separate regions of high-impurity concentration below each of said collectors in the layer immediately below said uppermost layer, said high-impurity regions being of the same conductivity type as the respective collectors under which they lie, each of said collector regions adjacent their said base-collector junction having substantially less impurity concentration than said associated regions respectively of high-impurity concentration, and at least one of said polycrystalline regions in proximity to each of said transistors, being doped with impurities of the same type as said region of high-impurity concentration lying below each respective transistors and being of low resistivity from the outer surface of said uppermost layer to said layer immediately therebelow, said low-resistivity polycrystalline regions being disposed laterally of said transistors and extending through said uppermost layer to a point in contact with said regions respectively of high impurity concentration whereby complementary transistors are provided which have both low resistance from the surface of said chip through said low-resistivity polycrystalline regions and said high-impurity concentration regions to said collectors respectively of said low-impurity concentration and a high breakdown voltage in the base-collector junction of each PNP transistor and of each NPN transistor.

2. An integrated circuit chip as set forth in claim 1 in which an isolation barrier is provided between said transistors.

3. An integrated circuit chip as set forth in claim 1 in which PN junction isolation is provided between each of said transistors.

* * * * *